(12) United States Patent
Gandhi et al.

(10) Patent No.: US 10,930,611 B1
(45) Date of Patent: Feb. 23, 2021

(54) SOLDER JOINTS FOR BOARD LEVEL RELIABILITY

(71) Applicant: Xilinx, Inc., San Jose, CA (US)

(72) Inventors: Jaspreet Singh Gandhi, San Jose, CA (US); Tien-Yu Lee, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/523,950

(22) Filed: Jul. 26, 2019

(51) Int. Cl.
*H01L 23/00* (2006.01)

(52) U.S. Cl.
CPC .............. *H01L 24/27* (2013.01); *H01L 24/83* (2013.01); *H01L 2224/29111* (2013.01); *H01L 2224/81815* (2013.01); *H01L 2924/014* (2013.01); *H01L 2924/0105* (2013.01); *H01L 2924/01029* (2013.01); *H01L 2924/01046* (2013.01); *H01L 2924/14* (2013.01)

(58) Field of Classification Search
CPC ...................... H01L 24/27; H01L 24/83; H01L 2924/01046; H01L 2224/81815; H01L 2224/29111; H01L 2924/14; H01L 2924/01029; H01L 2924/0105; H01L 2924/014
See application file for complete search history.

(56) References Cited

U.S. PATENT DOCUMENTS

| | | | |
|---|---|---|---|
| 7,550,852 B2 | 6/2009 | Tellkamp et al. | |
| 10,319,606 B1* | 6/2019 | Gandhi | H01L 24/73 |
| 2013/0175683 A1* | 7/2013 | Hsiao | H01L 24/05 257/737 |

OTHER PUBLICATIONS

Tegehall, Per-Erik, Ph.D., "Review of the Impact of Intermetallic Layers on the Brittleness of Tin-Lead and Lead-Free Solder Joints" IVF Industrial Research and Development Corporation, Mar. 10, 2005.
Wolverton, Mike, "Solder Joint Embrittlement Mechanisms, Solutions and Standards" 2014 Raytheon Company, as originally published in the IPC APEX EXPO Conference Proceedings,(http://www.circuitinsight.com/pdf/solder_joint_embrittlement_mechanisms_solutions_standards_ipc.pdf).

* cited by examiner

*Primary Examiner* — Edward Chin
(74) *Attorney, Agent, or Firm* — Patterson + Sheridan, LLP

(57) ABSTRACT

An integrated circuit assembly having an improved solder connection, and methods for fabricating the same are provided that utilize platelets within the solder connections to inhibit solder connection failure, thus providing a more robust solder interface. In one example, an integrated circuit assembly is provided that includes a package substrate having a first plurality of contact pads exposed on a first surface of the package substrate and a second plurality of contact pads exposed on a second surface of the package substrate. The second plurality of contact pads have a pitch that is greater than a pitch of the first plurality of contact pads. Interconnect circuitry is disposed in the package substrate and couples the first and second pluralities of contact pads. At least a first contact pad of the second plurality of contact pads includes a solder ball disposed directly in contact with a palladium layer.

18 Claims, 5 Drawing Sheets

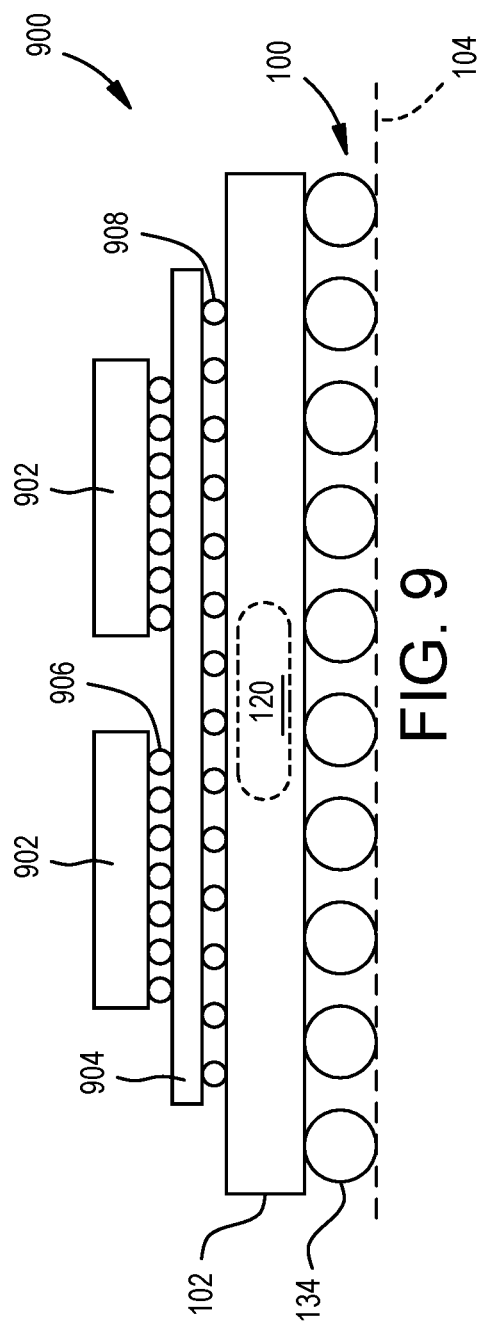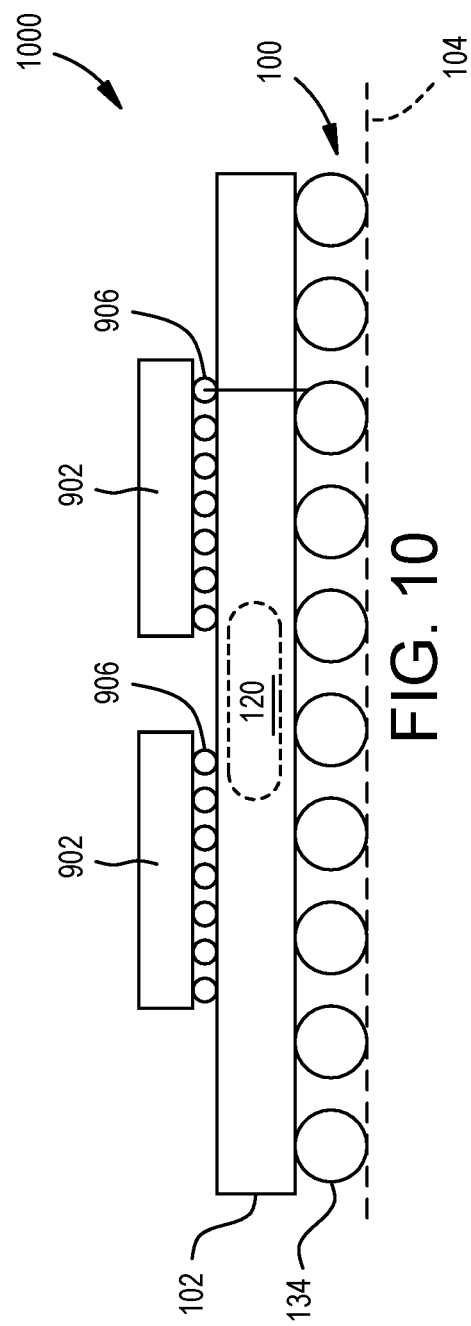

SOLDER JOINTS FOR BOARD LEVEL RELIABILITY

TECHNICAL FIELD

Examples of the present disclosure generally relate to chip packages, and in particular, to chip packages having solder connections with platelets at the solder to contact pad interface.

BACKGROUND

Electronic devices, such as tablets, computers, copiers, digital cameras, smart phones, control systems and automated teller machines, among others, often employ electronic components which leverage chip packages for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. The package substrate, and hence the chip package, is typically mounted to a printed circuit board (PCB) utilizing a ball grid array (BGA). The BGA generally comprises solder connections in the form of an array of solder balls. The solder balls are reflowed to mechanically secure and provide electrical connection between the chip package and the PCB.

As the size of the IC dies utilized in the chip packages increase, warpage and thermal stress of the substrates utilized in the chip packages has also increased. The stress and warpage of the substrates are undesirably transferred to the solder connections coupling the chip package to the PCB. The increased stress often leads to failure of the solder connection, typically through fracture within the solder ball itself, or at the interface between the solder ball and copper mounting pad of the package substrate. These problems are further exasperated by the use of lead-free solder, which is more prone to cracking as compared to conventional lead-based solder. Of course, degradation and failure of the solder connection is highly undesirable.

Thus, there is a need for an improved solder connection.

SUMMARY

An integrated circuit assembly having an improved solder connection, and methods for fabricating the same are provided that utilize platelets within the solder connections to inhibit solder connection failure, thus providing a more robust solder interface. In one example, an integrated circuit assembly is provided that includes a package substrate having a first plurality of contact pads exposed on a first surface of the package substrate and a second plurality of contact pads exposed on a second surface of the package substrate. The second plurality of contact pads have a pitch that is greater than a pitch of the first plurality of contact pads. Interconnect circuitry is disposed in the package substrate and couples the first and second pluralities of contact pads. At least a first contact pad of the second plurality of contact pads includes a solder ball disposed directly in contact with a palladium layer.

The solder ball of integrated circuit assembly includes platelets formed at an interface between the solder ball and the palladium layer. The platelets extend in a direction away from the first contact pad.

In another example, the platelets have an orientation that is at an angle less than 45 degrees relative to an imaginary line extending normally to a plane define by the first surface of the package substrate.

The solder ball may be fabricated from lead-free or lead-based solder. The lead-free or lead-based solder may optionally be micro-alloyed.

In another example, an integrated circuit assembly includes a package substrate, a first plurality of contact pads exposed on a first surface of the package substrate and a second plurality of contact pads exposed on a second surface of the package substrate. A pitch of the second plurality of contact pads is greater than a pitch of the first plurality of contact pads. Interconnect circuitry is disposed in the package substrate and couples the first and second pluralities of contact pads. At least a first contact pad of the second plurality of contact pads includes a solder ball dispose directly in contact with a palladium layer, and palladium comprising platelets formed at an interface between the solder ball and the palladium layer. The platelets have an orientation that is at an angle less than 45 degrees relative to an imaginary line extending normally to a plane define by the first surface of the package substrate.

In another example, the platelets are comprised of $PdSn_4$. In another example, the solder ball is fabricated from micro-alloyed lead-free solder.

In yet another example, a method for forming an integrated circuit assembly is provided. The method includes depositing a palladium layer on a contact pad of a package substrate, and depositing a solder ball directly on the palladium layer.

The method may include forming palladium containing platelets in the solder ball.

In another example, the palladium containing platelets are formed with an orientation that is less than 45 degrees relative to an imaginary line passing normally through the package substrate.

In another example, depositing the solder ball further includes depositing lead-free solder material on the package substrate. The lead-free solder material may optionally be micro-alloyed.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 9-10 are schematic front views of chip packages formed in accordance with the method set forth in FIG. 3.

To facilitate understanding, identical reference numerals have been used, where possible, to designate identical elements that are common to the figures. It is contemplated that elements of one example may be beneficially incorporated in other examples.

DETAILED DESCRIPTION

Described herein are solder interconnects for integrated circuit assemblies, such as chip packages among others, that beneficially inhibit fracture defects within the solder connection. The improved solder connections described herein are most advantageously utilized to mount a package substrate to a printed circuit board. The solder interconnects leverage over platelets within the solder balls that have an orientation substantially normal to the plane of the package substrate. The platelets form within the solder ball proximate the interface between the solder ball and a mounting pad exposed on the surface of the package substrate. The platelets disrupt the alignment of grain boundaries within the solder comprising the ball, thus essentially inhibiting crack propagation at the solder ball to mounting pad interface. Consequently, the resultant platelet containing solder connection is highly strain resistant. Thus, the board level reliability of chip packages utilizing the platelet containing solder connections is significantly improved, even when utilized with lead-free solder which is conventionally more prone to cracking failure.

Figure 1:
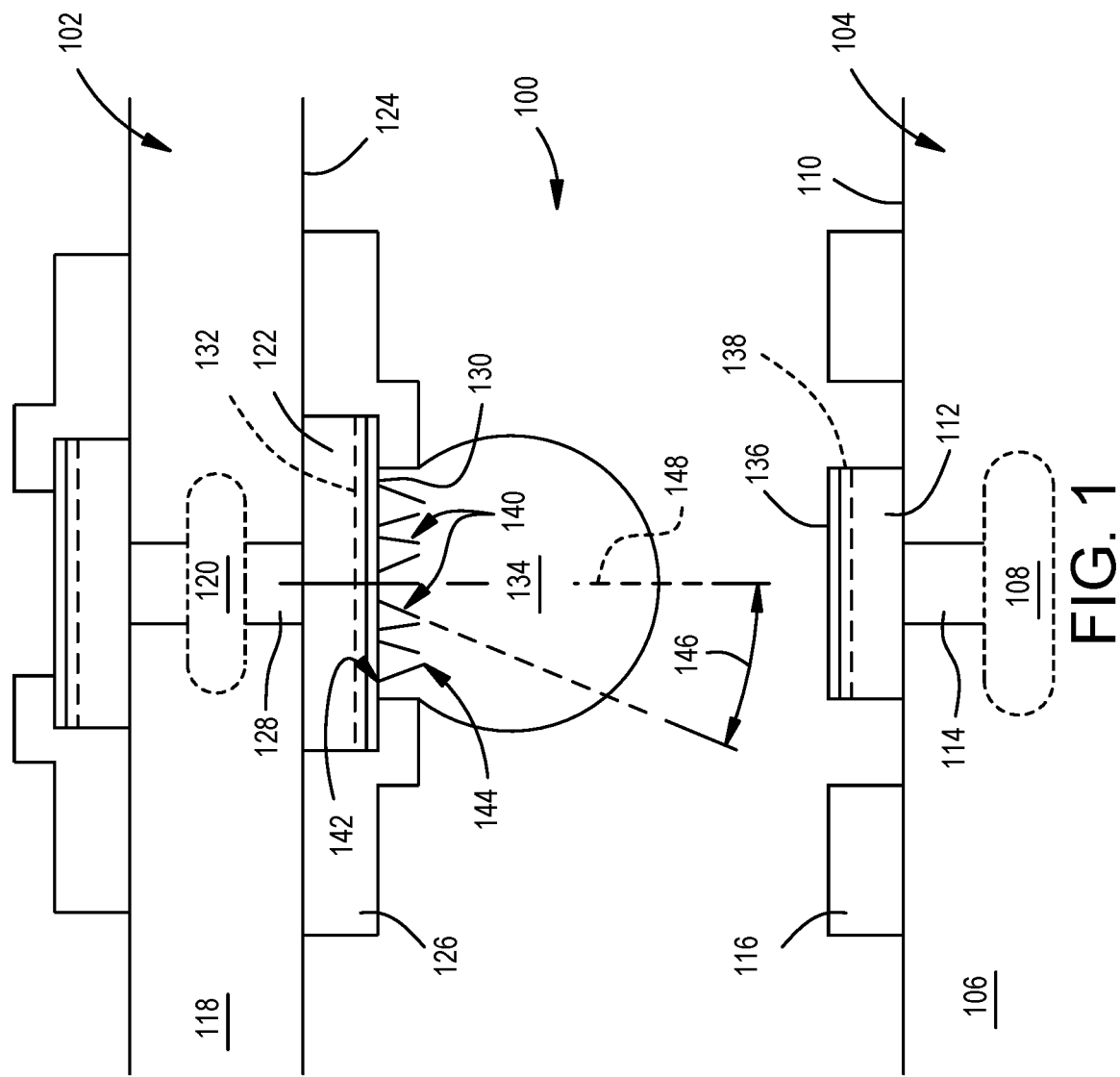
FIG. 1 is an exploded partial schematic front view of a solder connection configured to mount a package substrate of a chip package to a printed circuit board (PCB).

Turning now to FIG. 1, FIG. 1 is an exploded partial schematic front view of a solder connection 100 configured to mount a package substrate 102 of a chip package to a printed circuit board (PCB) 104. Non-limiting examples of exemplary chip packages are later described with reference to FIGS. 9-10. As utilized herein, the components of the chip package, the chip package itself, and also an electronic device formed by mounting a chip package to the PCB, may be referred to an integrated circuit assembly.

The PCB 104, which is partially shown in FIG. 1, generally includes a body 106 and circuitry 108. The circuitry 108 is connected to a plurality of contact pads 112 exposed on a top surface 110 of the PCB 104 by conductive routing 114. A solder resist (or other dielectric) layer 116 is also disposed on the top surface 110 of the PCB 104. The solder resist layer 116 includes openings through which the contact pads 112 are exposed.

The package substrate 102, which is also partially shown in the exploded view of FIG. 1, generally includes a body 118 and interconnect circuitry 120. The interconnect circuitry 120 is connected to a plurality of contact pads 122 exposed on a first surface 124 of the package substrate 102 by conductive routing 128.

Figure 2:
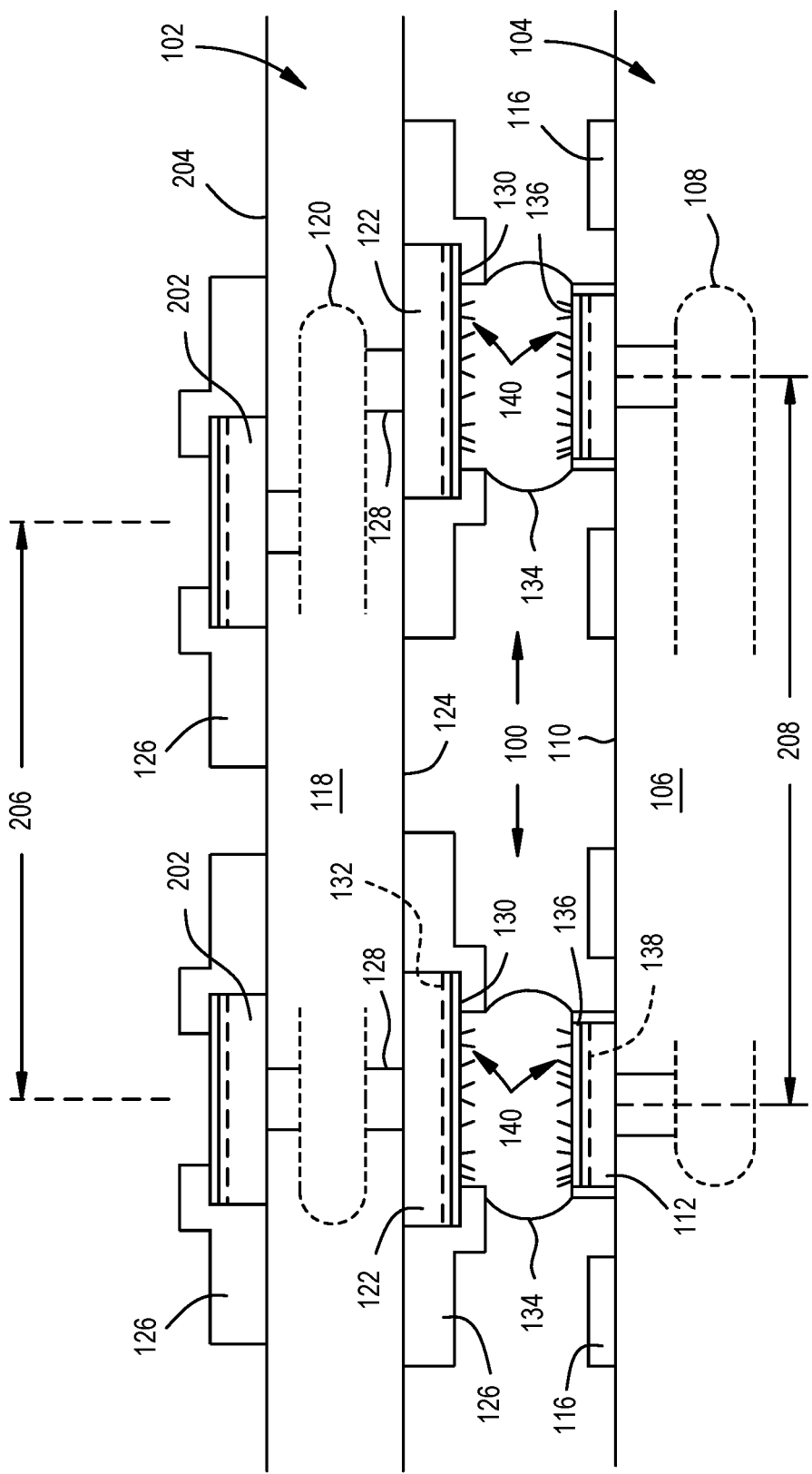
FIG. 2 is a partial schematic front view of the solder connection coupling the chip package to the PCB.

Referring briefly to FIG. 2, the interconnect circuitry 120 is also connected to a plurality of contact pads 202 exposed on a second surface 204 of the package substrate 102 by conductive routing 128. A pitch 206 of the contact pads 202 is generally less than a pitch 208 of the contact pads 112, 122. The pitch 206, 208 may be measure from a centerline of the pads 112, 122, 202 or other suitable location. The interconnect circuitry 120 generally provides a ground, signal and power transmission path between the contact pads 122, 202. The contact pads 202 are utilized to couple the package substrate 102 to integrated circuit (IC) dies, and in some chip packages, using in interposer disposed between the package substrate 102 and the IC dies, as further described below. Optionally, the contact pads 202 may also include a palladium layer and optional interstitial layer as described with reference to the contact pads 122.

Returning to FIG. 1, a solder resist (or other dielectric) layer 126 is also disposed on the first surface 124 of the package substrate 102. The solder resist layer 126 includes openings through which the contact pads 122 are exposed. The contact pads 122 may be formed from copper or other suitable electrically conductive material.

A palladium layer 130 and a solder ball 134 are disposed on the contact pads 122. The solder ball 134 is in direct contact with the palladium layer 130. Generally, the palladium layer 130, the surface of the contact pad 122 facing the PCB 104 and the first surface 124 are parallel to each other.

The palladium layer 130 may be formed on the contact pad 122 by electroplating, electroless plating, inkjet printing, additive manufacturing techniques (such as 3-D printing and the like), chemical vapor deposition, physical vapor deposition or other suitable technique. Generally, the thickness of the palladium layer 130 is less than about 0.5 μm. In one example the thickness of the palladium layer 130 is between 0.15 μm and 0.40 μm. In yet another example, the thickness of the palladium layer 130 is less than about 0.3 μm.

At least one electrically conductive interstitial layer 132 (shown in phantom) may optionally be disposed between the palladium layer 130 and the contact pad 122. The interstitial layer 132 may include one or more conductive layers. The interstitial layer 132 may be fabricated from nickel, gold, nickel-vanadium (NiV), nickel-vanadium (NiV) alloy, chromium, among other suitable conductive materials. Nickel-vanadium (NiV) alloy may include small amounts of iron, nitrogen and oxygen. When utilized, the total thickness of the interstitial layer 132 (i.e., the one or more layers making up the interstitial layer 132) may be greater than a thickness of the palladium layer 130. In one example, the thickness of the interstitial layer 132 is at least twice the thickness of the palladium layer 130.

Optionally, the contact pads 112 of the PCB 104 may also include an exposed palladium layer 136. An optional interstitial layer 138 may be disposed between the contact pads 112 of the PCB 104 and the exposed palladium layer 136. The palladium layer 136 may be fabricated as described above with reference to the palladium layer 130. The interstitial layer 138, when present, may be fabricated as described above with reference to the interstitial layer 132.

The solder ball 134 may be fabricated from any suitable solder material. In one example, solder ball 134 is a lead-based solder, such as tin-lead solder, among others. In another example, the solder ball 134 is a lead-free solder, such as tin-copper solder, tin-silver-copper (SnAgCu, also referred to as SAC) solder, and tin-silver-copper-bismuth (SnAgCuBi, also referred to as SAC+Bi and SAC-Q), among others. The lead-free or lead-based solder may be micro-alloyed, for example by adding nickel and/or aluminum to the base solder material. Micro-alloyed solder advantageously has a finer grain boundary, and thus, greater resistance to stress cracking, particularly in the center regions of the solder ball 134.

The solder ball 134 includes platelets 140 formed in a region of the solder ball 130 adjacent the contact pad 122. The platelets 140 are generally elongated, having a first end 142 and a second end 144. The first end 142 of the platelets 140 is generally proximate to or extending into the palladium layer 130. The second end 144 of the platelets 140 extends in a direction away from the palladium layer 130 in a direction substantially normal to the first surface 124 of the package substrate 102. The directional orientation (defined between the first and second ends 142, 144) of the platelets 140 defines an angle 146 relative to an imaginary line 148 that extends normal to the first surface 124 of the package substrate 102. The angle 146 of the platelets 140 is generally less than 45 degrees. In some examples, the angle 146 of the platelets 140 is less than 30 degrees. In some examples, the angle 146 of the platelets 140 is less than 15 degrees. The angle 146 of the platelets 140 provides an orientation that is substantially normal to the contact pad 122. Thus, the angle 146 of the platelets 140 substantially prevents lateral crack propagation at the interface between the solder ball 134 and the contact pad 122, which is a common failure mode in conventional designs.

The platelets 140 are generally formed from the material of the palladium layer 130 that diffuses or otherwise migrates into the solder ball 134. In one example, the platelets 140 are formed from a palladium and tin alloy, such as $PdSn_4$. The platelets 140 may diffuse into the solder ball 134 at room temperature. The speed at which the platelets 140 diffuse into the solder ball 134 may be increased by heating the palladium layer 130 and the solder ball 134. In one example, the palladium layer 130 and the solder ball 134 is heated when the solder ball 134 is reflowed.

As discussed above, the solder connection 100 includes the contact pads 112, 122, the palladium layer 130, the optional interstitial layer 132, and the solder ball 134. The solder balls 134, after reflow, mechanically and electrically connect the circuitry 108 of the PCB 104 to the circuitry 120 of the package substrate 102, as illustrated in FIG. 2. After reflow, the solder ball 134 may additionally flow around the sides of the contact pad 112 of the PCB 104, further strengthening the interface of the solder connection 100 with the PCB 104.

As illustrated in FIG. 2, the orientation of the platelets 140 disrupts the alignment of grain boundaries at the interface of the contact pad 122 and solder ball 134 of the solder connection 100. Thus, the platelets 140 inhibit and substantially prevent propagation of micro cracks may format the interface of the solder ball 134 and contact pad 122. Accordingly, the solder interface 100 that includes the palladium platelets 140 is much more robust and crack resistant as compared to conventional solder interconnects. Furthermore, when used in conjunction with micro-alloyed lead-free solder material to form the solder balls 134, micro-fractures within the solder ball 134 are also inhibited by the micro-alloyed material, thus forming a very robust solder interconnect 100 even when fabricated with lead-free solder materials. Accordingly, the robust solder interconnect 100 provides the chip package with excellent board level reliability.

When the palladium layer 136 is utilized on the contact pads 112 of the PCB 104, the palladium layer 136 contacts the solder ball 134 when the package substrate 102 of the chip package is mounted to the PCB 104. Thus, upon reflow of the solder ball 134, platelets 140, formed from the material of the palladium layer 136, also form in the solder ball 134 proximate the interface of the solder ball 134 and the contact pad 112. The platelets 140 formed from the palladium layer 136 strengthen and make more crack resistant solder interconnect 100 at the interface between the solder ball 134 and PCB 104.

Figure 3:
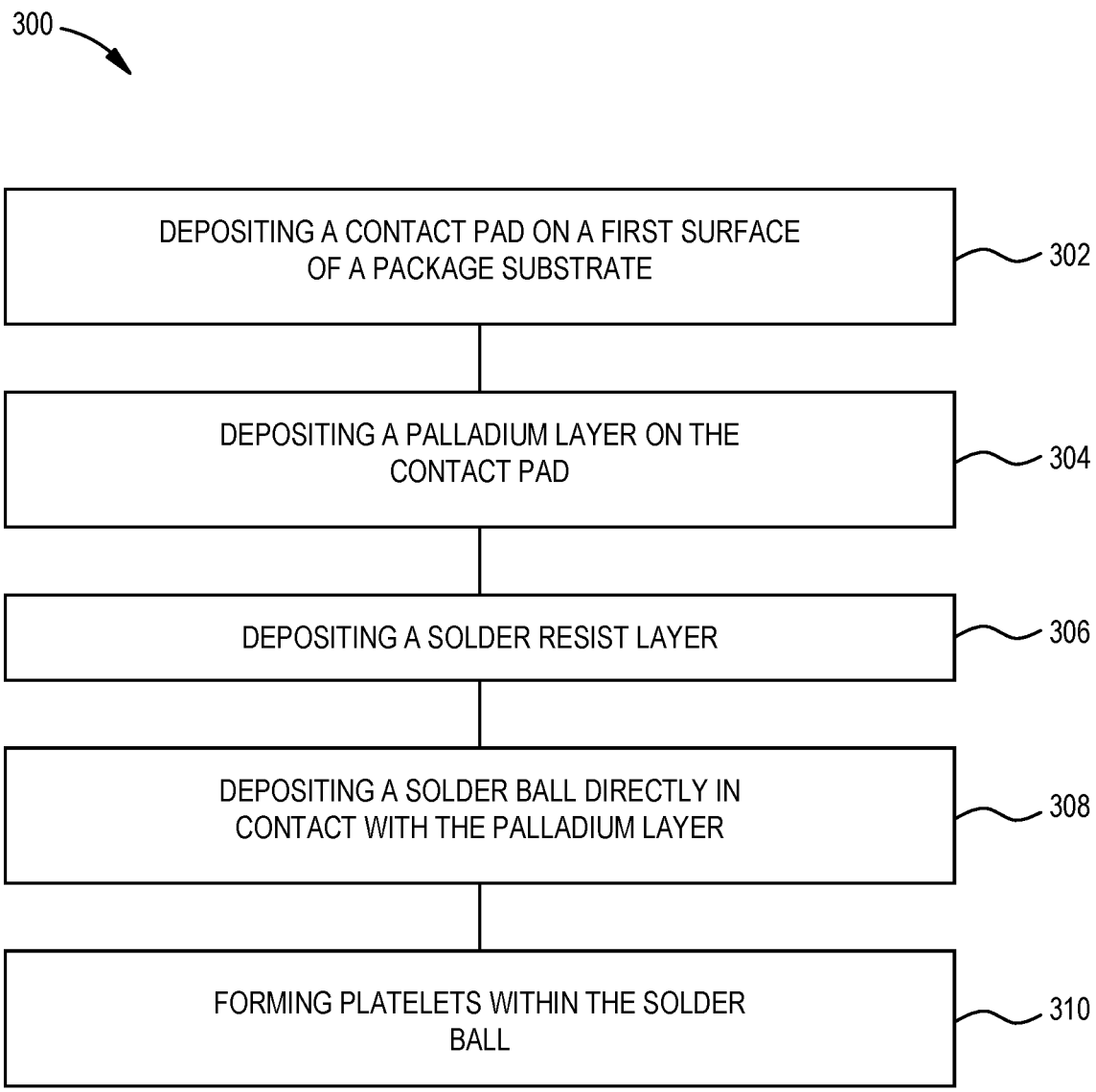
FIG. 3 is a flow diagram of a method for forming a chip package.

FIG. 3 is a flow diagram of an exemplary method 300 for forming in integrated circuit assembly, such as a package substrate, a chip package or an electronic device. FIGS. 4-7 depict a package substrate of the chip package in various stages of fabrication according to the method of FIG. 3, while FIGS. 9-10 are schematic front views of various chip packages that may be formed in accordance with the method set forth in FIG. 3.

Figure 4:
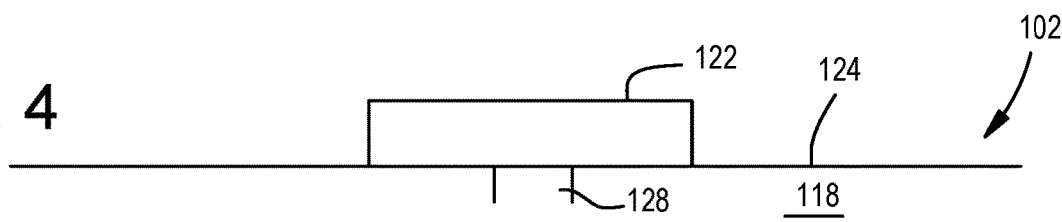
FIGS. 4-8 are schematic partial front views of a package substrate during various stages of forming a chip package in accordance with the method set forth in FIG. 3.

The method 300 begins at operation 302 by depositing a contact pad 122 on a first surface 124 of a package substrate 102, as shown in FIG. 4. The contact pad 122 may be deposited by plating or other suitable technique. In one example, the contact pad 122 is made of copper. The package substrate 102 is part of a chip package, examples of when are later shown and described below with reference to FIGS. 9-10.

Figure 5:
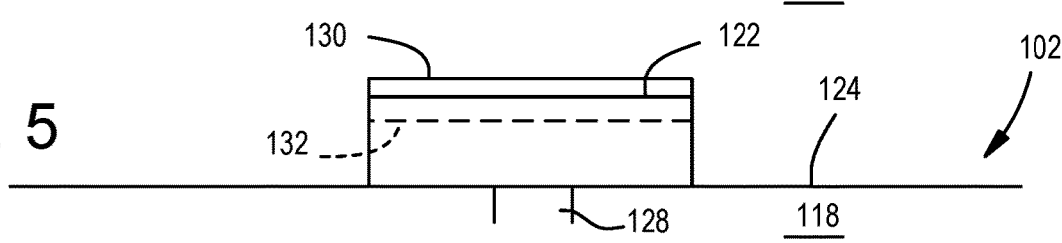

At operation 304, a palladium layer 130 is deposited on the contact pad 122, as shown in FIG. 5. The palladium layer 130 may be deposited by electroplating, electroless plating, chemical vapor deposition, or other suitable technique. The thickness of the deposited palladium layer is less than 0.5 µm. In one example, the palladium layer 130 is deposited directly on the contact pad 122. In another example, an interstitial layer 132 comprising one or more conductive layers may be deposited directly on the contact pad 122, with the palladium layer 130 subsequently deposited on the interstitial layer 132. When present, the interstitial layer 132 may have a thickness greater than a thickness of the palladium layer 130.

Figure 6:
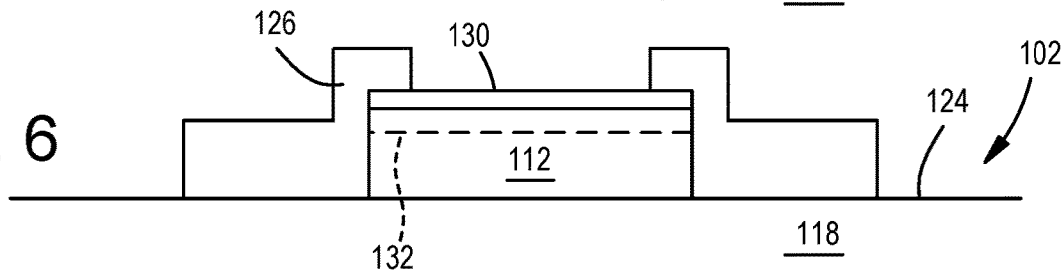

At operation 306, a solder resist layer 126 is deposited on package substrate 102, as shown in FIG. 6. The solder resist layer 126 may be deposited before, or after, deposition of the contact pad 122 and/or palladium layer 130. In one example, the solder resist layer 126 is deposited over a portion of the palladium layer 130, such that a center portion of the palladium layer 130 is exposed through openings in the solder resist layer 126. Alternatively, the solder resist layer 126 does not overlay the palladium layer 130.

Figure 7:
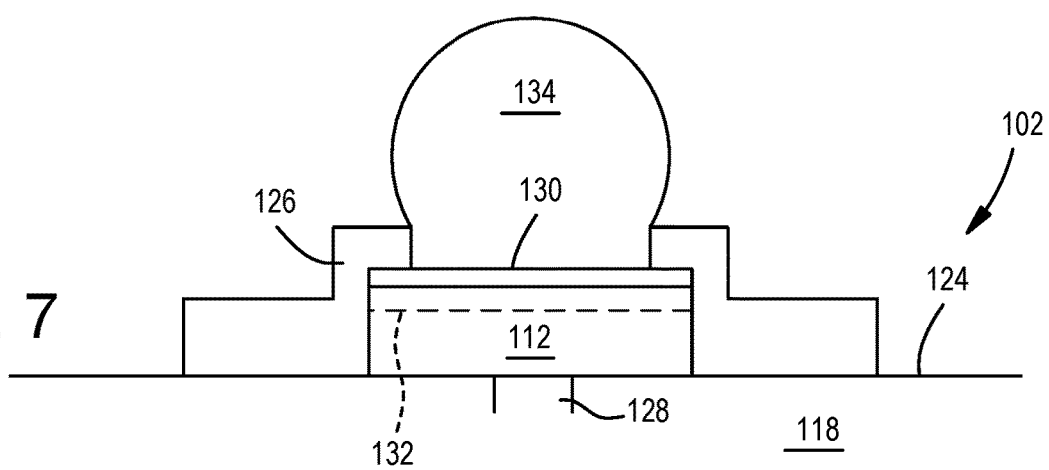

At operation 308, a solder ball 134 is deposited directly in contact with the palladium layer 130, as shown in FIG. 7. The solder ball 134 may be deposited using a printing process or other suitable technique. The solder ball 134 may be any suitable type of solder, such as lead-based or lead-free solder. The material comprising the solder ball 134 may be a micro-alloy. Some non-limiting examples of materials suitable for use as the solder ball include, but are not limited to, SAC and SAC-Q.

Figure 8:
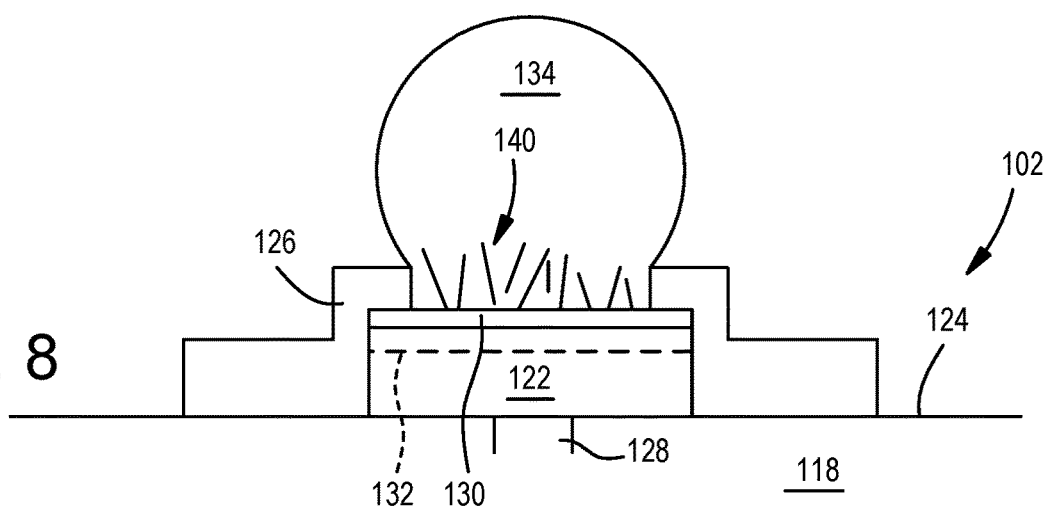

At operation 310, platelets 140 are formed within the solder ball 134, as shown in FIG. 8. In one example, material from the palladium layer 130 may diffuse into the material of the solder ball 134 to form the platelets 140. The platelets 140 have an elongated orientation extending away from the palladium layer 130 into the solder ball 134. The orientation of the platelets 140 may be substantially normal to the plane defined by the first surface 124 of the package substrate 102. Stated differently, the orientation of the platelets 140 may be substantially normal to the plane defined by the surface of the contact pad 122 that faces outward from the package substrate 102. The platelets 140 may defuse into the solder ball 134 over time. In one example, the platelets 140 are at least partially formed during reflow of the solder ball 134 after deposited of the solder ball 134 on the contact pad 122. In one example, the orientation of the platelets 140, defined by an angle 146 with an imaginary line 148 extending normally from the first surface 124 of the package substrate 102, is less than 45 degrees.

A chip package fabricated in accordance with the method 300 described above includes at least one integrated circuit (IC) die 902 mounted to the package substrate 102. In the example depicted in FIG. 9, a chip package 900 includes at least one IC die 902 mounted to an interposer 904, with the interposer 904 mounted to the package substrate 102. Solder connections 906 electrically and mechanically connect the circuitry of the IC die 902 mounted to an interposer 904, while solder connections 908 electrically and mechanically connect the circuitry of the interposer 904 to the circuitry 120 of the package substrate 102. The solder balls 134 formed on the bottom of the chip package 900 are utilized to form solder interconnects 100 with a PCB 104 (shown in phantom) to form an electronic device. Alternatively as shown in FIG. 10, the IC die 902 may be mounted directly to the package substrate 102 without the use of an interposer to form a chip package 1000. Although two IC dies 902 are illustrated in FIGS. 9-10, a single or three or more IC dies 902 may be mounted to the package substrate 102 and/or interposer 904. The two IC dies 902 may be logic, memory or other desired die.

When the chip package is mounted to the PCB 104, the solder balls 134 are reflowed to, thus electrically and mechanically coupling the circuitry 108 of the PCB 104 to the circuitry 120 of the package substrate 102, and consequentially to the solid-state circuitry of the IC die 902. The platelets 140 present in the solder balls 134 substantially inhibit propagation of micro cracks that often form at the interface between the solder ball and the contact pad of conventional electronic devices. Thus, chip packages having platelets 134 present in the solder balls 134 utilized to couple the chip package to a PCB 102 have excellent board level reliability due to the robust and crack resistant solder interconnect 100 between the package substrate 102 of the chip package and the PCB 104.

Thus, a crack resistant solder interconnect has been described above which advantageously resist cracking at the interface coupling the chip package to a PCB board. The crack resistant solder interface may also be formed utilizing micro-alloyed solder, which further reduces the probability of micro cracks forming within the central region of the solder ball, further increasing the reliability of the solder interconnect. The robust and crack resistant solder connect is particularly suitable for use with large chip packages which are susceptible to warpage, even when lead-free solder is utilized.

While the foregoing is directed to specific examples, other and further examples may be devised without departing from the basic scope thereof, and the scope thereof is determined by the claims that follow.

What is claimed is:

1. An integrated circuit assembly comprising:
   a package substrate having a first surface and a second surface;
   a first plurality of contact pads exposed on the first surface of the package substrate;
   a second plurality of contact pads exposed on the second surface of the package substrate, a pitch of the second plurality of contact pads is greater than a pitch of the first plurality of contact pads;
   interconnect circuitry disposed in the package substrate and coupling the first and second pluralities of contact pads; wherein at least a first contact pad of the second plurality of contact pads further comprises:
      a palladium layer disposed on the first contact pad of the second plurality of contact pads; and
      a solder ball disposed directly in contact with the palladium layer, wherein the solder ball further comprises platelets having a first end and a second end, the platelets formed at an interface between the solder ball and the palladium layer, the first end of the platelets proximate the palladium layer and the second end of the platelets extending in a direction away from the first contact pad or the second contact pad.

2. The integrated circuit assembly of claim 1, wherein the platelets comprise:
   palladium.

3. The integrated circuit assembly of claim 1, wherein the platelets comprise:
   tin and palladium.

4. The integrated circuit assembly of claim 3, wherein the platelets are $PdSn_4$.

5. The integrated circuit assembly of claim 1, wherein the platelets have an orientation that is substantially normal to a plane defined by the first surface of the package substrate.

6. The integrated circuit assembly of claim 1, wherein the platelets have an orientation that is at an angle less than 45 degrees relative to an imaginary line extending normally to a plane define by the first surface of the package substrate.

7. The integrated circuit assembly of claim 1, wherein the solder ball comprises:
   lead-free solder.

8. The integrated circuit assembly of claim 1, wherein the solder ball comprises:
   micro-alloyed lead-free solder.

9. An integrated circuit assembly comprising:
   a package substrate having a first surface and a second surface;
   a first plurality of contact pads exposed on the first surface of the package substrate;
   a second plurality of contact pads exposed on the second surface of the package substrate, a pitch of the second plurality of contact pads is greater than a pitch of the first plurality of contact pads;
   interconnect circuitry disposed in the package substrate and coupling the first and second pluralities of contact pads, wherein at least a first contact pad of the second plurality of contact pads further comprises:
      a palladium layer disposed on the first contact pad of the second plurality of contact pads;
      a solder ball disposed directly in contact with the palladium layer; and
      palladium comprising platelets formed at an interface between the solder ball and the palladium layer, the platelets having an orientation that is at an angle less than 45 degrees relative to an imaginary line extending normally to a plane define by the first surface of the package substrate.

10. The integrated circuit assembly of claim 9, wherein the platelets further comprise:
    tin.

11. The integrated circuit assembly of claim 10, wherein the platelets are $PdSn_4$.

12. The integrated circuit assembly of claim 9, wherein the solder ball comprises:
    lead-free solder.

13. The integrated circuit assembly of claim 12, wherein the solder ball comprises:
    micro-alloyed lead-free solder.

14. A method for forming an integrated circuit assembly, the method comprising:
    depositing a palladium layer on a contact pad of a package substrate;
    depositing a solder ball directly on the palladium layer; and
    forming palladium containing platelets in the solder ball, wherein the platelets further comprise a first end and a second end, the platelets formed at an interface between the solder ball and the palladium layer, the first end of the platelets proximate the palladium layer and the second end of the platelets extending in a direction away from the contact pad.

15. The method of claim 14, wherein forming the palladium containing platelets in the solder ball further comprises:

forming palladium containing platelets having an orientation that is less than 45 degrees relative to an imaginary line passing normally through the package substrate.

16. The method of claim 15, wherein forming the palladium containing platelets in the solder ball further comprises:

reflowing the solder ball.

17. The method of claim 14, wherein depositing the solder ball further comprises:

depositing lead-free solder material on the package substrate.

18. The method of claim 17, wherein depositing lead-free solder material further comprises:

depositing lead-free micro-alloyed solder material on the package substrate.

\* \* \* \* \*